(12) United States Patent
Chang et al.

(10) Patent No.: US 11,227,874 B2
(45) Date of Patent: Jan. 18, 2022

(54) PHOTOSENSITIVE ELEMENT HAVING SUBSTANTIALLY FLAT INTERFACE BETWEEN ELECTRODE AND PHOTOSENSITIVE LAYER AND MANUFACTURING METHOD THEREOF

(71) Applicant: Au Optronics Corporation, Hsinchu (TW)

(72) Inventors: Po-Chao Chang, Taoyuan (TW); Ruei-Pei Chen, Hsinchu County (TW); Kuo-Yu Huang, Hsinchu County (TW); Chao-Chien Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/360,037

(22) Filed: Mar. 21, 2019

(65) Prior Publication Data
US 2019/0371823 A1     Dec. 5, 2019

(30) Foreign Application Priority Data

May 29, 2018 (TW) .................................. 107118347

(51) Int. Cl.
*H01L 27/14*     (2006.01)
*H01L 27/12*     (2006.01)
(Continued)

(52) U.S. Cl.
CPC .......... *H01L 27/1225* (2013.01); *G03F 7/075* (2013.01); *G03F 7/094* (2013.01); *G03F 7/11* (2013.01)

(58) Field of Classification Search
CPC ... H01L 31/02–02002; H01L 27/14683; H01L 31/173; G03F 7/093–11; G06K 9/0004
See application file for complete search history.

(56) References Cited

U.S. PATENT DOCUMENTS

| 5,216,491 A | 6/1993 | Yamamoto et al. |
| 8,368,068 B2 | 2/2013 | Cho et al. |

(Continued)

FOREIGN PATENT DOCUMENTS

| CN | 102629610 | 8/2012 |
| CN | 102682271 | 9/2012 |

(Continued)

*Primary Examiner* — Suberr L Chi
(74) *Attorney, Agent, or Firm* — JCIPRNET

(57) ABSTRACT

A photosensitive element and a manufacturing method thereof are provided. The manufacturing method of the photosensitive element includes successively depositing a second conductive layer, a photosensitive material layer, and a first top electrode material layer on a substrate; forming a first patterned photoresist layer on the first top electrode material layer; patterning the first top electrode material layer by using the first patterned photoresist layer as a mask to form a first top electrode; removing the first patterned photoresist layer; patterning the photosensitive material layer by using the first top electrode as a mask to form a photosensitive layer; forming an insulation layer having an opening on the first top electrode; and forming a second top electrode on the insulation layer, and the second top electrode is electrically connected to the first top electrode via the opening.

20 Claims, 12 Drawing Sheets

(51) Int. Cl.
*G03F 7/075* (2006.01)
*G03F 7/09* (2006.01)
*G03F 7/11* (2006.01)

(56) References Cited

U.S. PATENT DOCUMENTS

| | | | |
|---|---|---|---|
| 8,907,923 B2 | 12/2014 | Cho et al. | |
| 9,035,405 B2 | 5/2015 | Wu | |
| 9,122,352 B2 | 9/2015 | Cho et al. | |
| 9,450,133 B2 | 9/2016 | Nakamura et al. | |
| 9,690,971 B2 | 6/2017 | Liao et al. | |
| 10,038,022 B1 | 7/2018 | Chen et al. | |
| 2010/0134735 A1 | 6/2010 | Nakamura et al. | |
| 2010/0237250 A1 | 9/2010 | Hayashi | |
| 2010/0321341 A1 | 12/2010 | Cho et al. | |
| 2012/0205646 A1 | 8/2012 | Cho et al. | |
| 2013/0207169 A1 | 8/2013 | Wu | |
| 2013/0221230 A1 | 8/2013 | Tredwell et al. | |
| 2013/0241077 A1* | 9/2013 | Fuergut | H01L 23/5389 257/774 |
| 2013/0270618 A1* | 10/2013 | Fan | H01L 27/1462 257/290 |
| 2015/0062088 A1 | 3/2015 | Cho et al. | |
| 2015/0144796 A1* | 5/2015 | Tredwell | H01L 27/14689 250/366 |
| 2016/0232397 A1* | 8/2016 | Yu | G06K 9/00046 |
| 2017/0124373 A1* | 5/2017 | Liao | H01L 27/14612 |

FOREIGN PATENT DOCUMENTS

| | | |
|---|---|---|
| CN | 103730463 | 4/2014 |
| CN | 102354695 | 12/2014 |
| CN | 105390518 | 3/2018 |
| JP | 2010153834 | 7/2010 |
| TW | 201100904 | 1/2011 |
| TW | 201334166 | 8/2013 |
| TW | I613804 | 2/2018 |

* cited by examiner

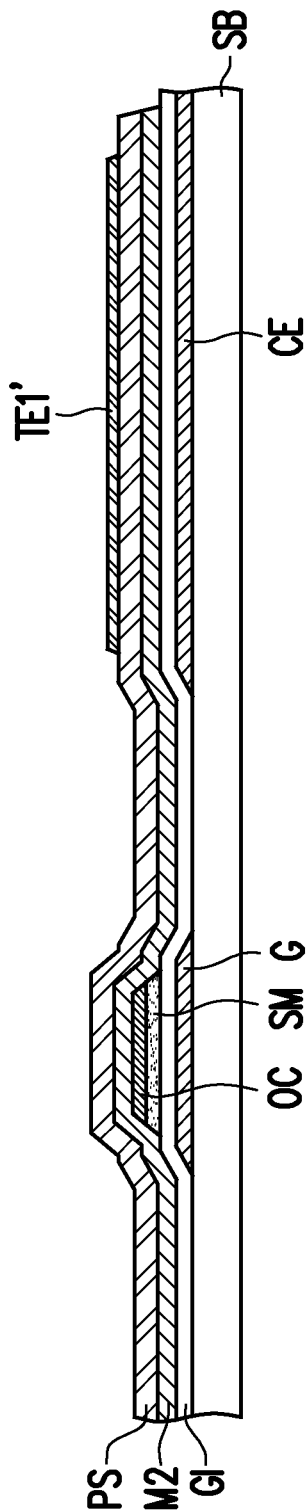
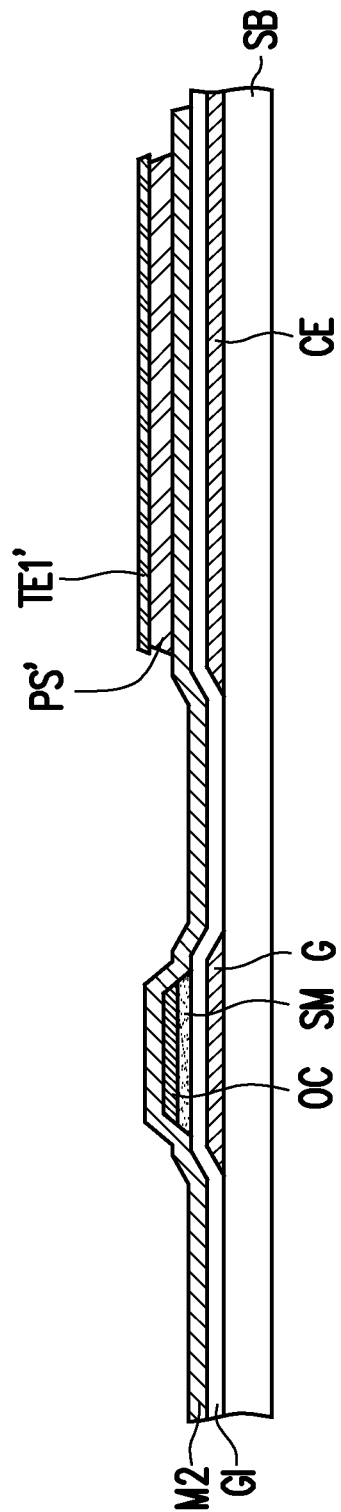
FIG. 1G
FIG. 1H

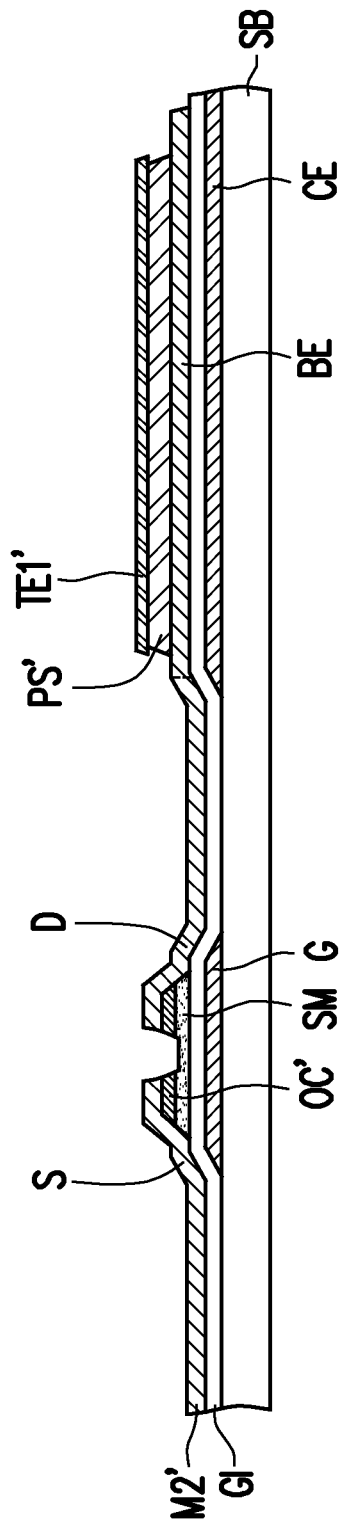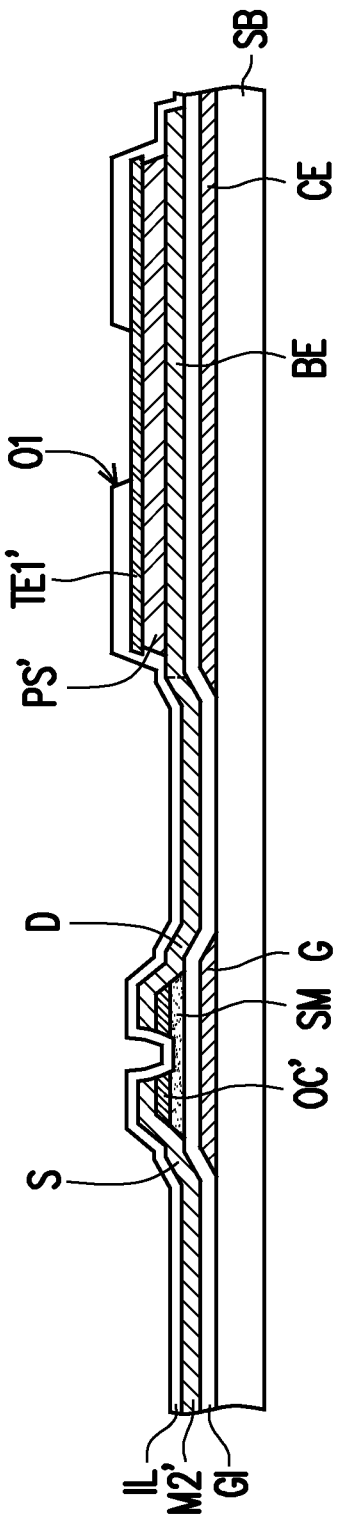

PHOTOSENSITIVE ELEMENT HAVING SUBSTANTIALLY FLAT INTERFACE BETWEEN ELECTRODE AND PHOTOSENSITIVE LAYER AND MANUFACTURING METHOD THEREOF

CROSS-REFERENCE TO RELATED APPLICATION

This application claims the priority benefit of Taiwan application serial no. 107118347, filed on May 29, 2018. The entirety of the above-mentioned patent application is hereby incorporated by reference herein and made a part of this specification.

BACKGROUND OF THE INVENTION

Field of the Invention

The invention relates to an electronic element and a manufacturing method thereof, and more particularly, to a photosensitive element and a manufacturing method thereof.

Description of Related Art

With the advancement in technology, the functions of personal electronic equipment are becoming more diverse. For instance, in addition to the phone function, current hand phones on the market often further contain functions frequently used in everyday life such as camera, video, note, internet, and etc. In these multifunction electronic equipment, a photosensitive element is often provided. The photosensitive element can detect an ambient light of an electronic product, and in addition to helping the user obtain better camera and video quality, some photosensitive elements can further detect fluctuations on the finger surface of a user such that the electronic product has the function of fingerprint recognition. How to increase the imaging quality of the photosensitive element to accurately recognize the fingerprint of a user is an urgent issue of various industries.

SUMMARY OF THE INVENTION

The invention provides a manufacturing method of a photosensitive element that can solve the issue of poor imaging caused by damage to an interface of a photosensitive layer.

The invention provides a photosensitive element that can solve the issue of poor imaging caused by damage to an interface of a photosensitive layer.

A manufacturing method of a photosensitive element of the invention includes the following. A second conductive layer, a photosensitive material layer, and a first top electrode material layer are successively deposited on a substrate. Next, a first patterned photoresist layer is formed on the first top electrode material layer, and the first top electrode material layer is patterned by using the first patterned photoresist layer as a mask to form a first top electrode. Next, the first patterned photoresist layer is removed and the photosensitive material layer is patterned by using the first top electrode as mask to form a photosensitive layer. Next, an insulation layer is formed on the first top electrode. The insulation layer has an opening. Next, a second top electrode is formed on the insulation layer, and the second top electrode is electrically connected to the first top electrode via the opening.

A photosensitive element of the invention includes a bottom electrode, a photosensitive layer, a first top electrode, an insulation layer, and a second top electrode. The bottom electrode, the photosensitive layer, and the first top electrode are stacked on a substrate in order. The material of the photosensitive layer includes a silicon-rich oxide. The bottom electrode and the photosensitive layer have a substantially flat interface therebetween. The insulation layer is disposed on the first top electrode. The insulation layer covers the first top electrode, the photosensitive layer, and the bottom electrode. The insulation layer has an opening. The second top electrode is electrically connected to the first top electrode via the opening.

Based on the above, the photosensitive element and the manufacturing method thereof can alleviate the issue of poor imaging of the photosensitive element to increase display quality.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the related art and the present invention and will not be interpreted as idealized or excessive. The formal meaning, unless explicitly defined in this article.

Exemplary embodiments are described herein with reference to cross-section illustrations that are schematic illustrations of idealized embodiments. Thus, variations in the shapes of the illustrations as a result, for example, of manufacturing techniques and/or tolerances are contemplated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. In addition, the acute angle shown can be round. Thus, the regions illustrated in the figures are schematic in nature and their shapes are not intended to illustrate the precise shape of a region and are not intended to limit the scope of the claims.

Figure 1A:
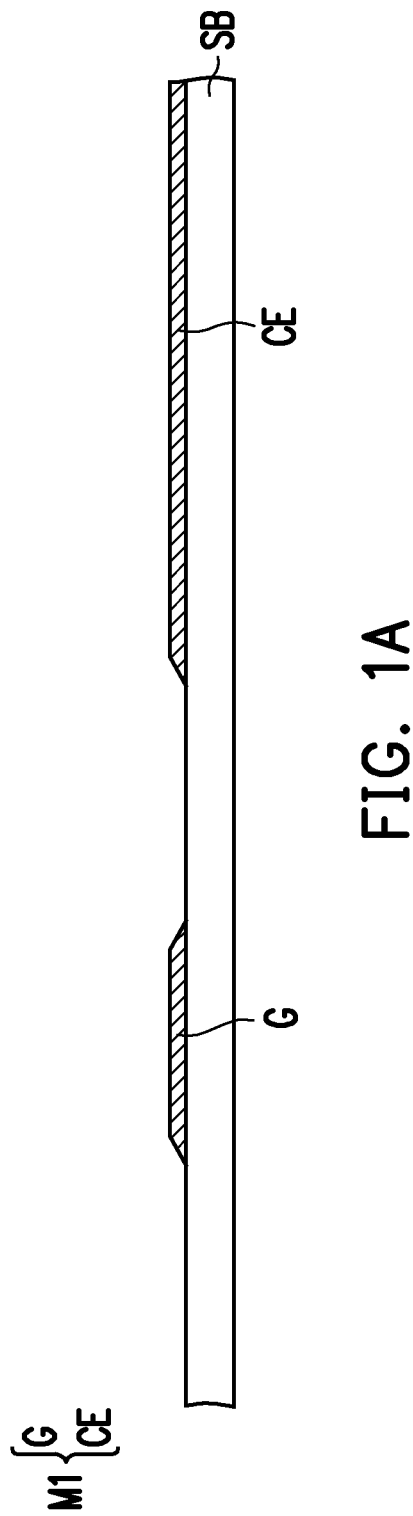
FIG. 1A to FIG. 1O are manufacturing process schematics of a photosensitive element according to an embodiment of the invention.
Figure 2:
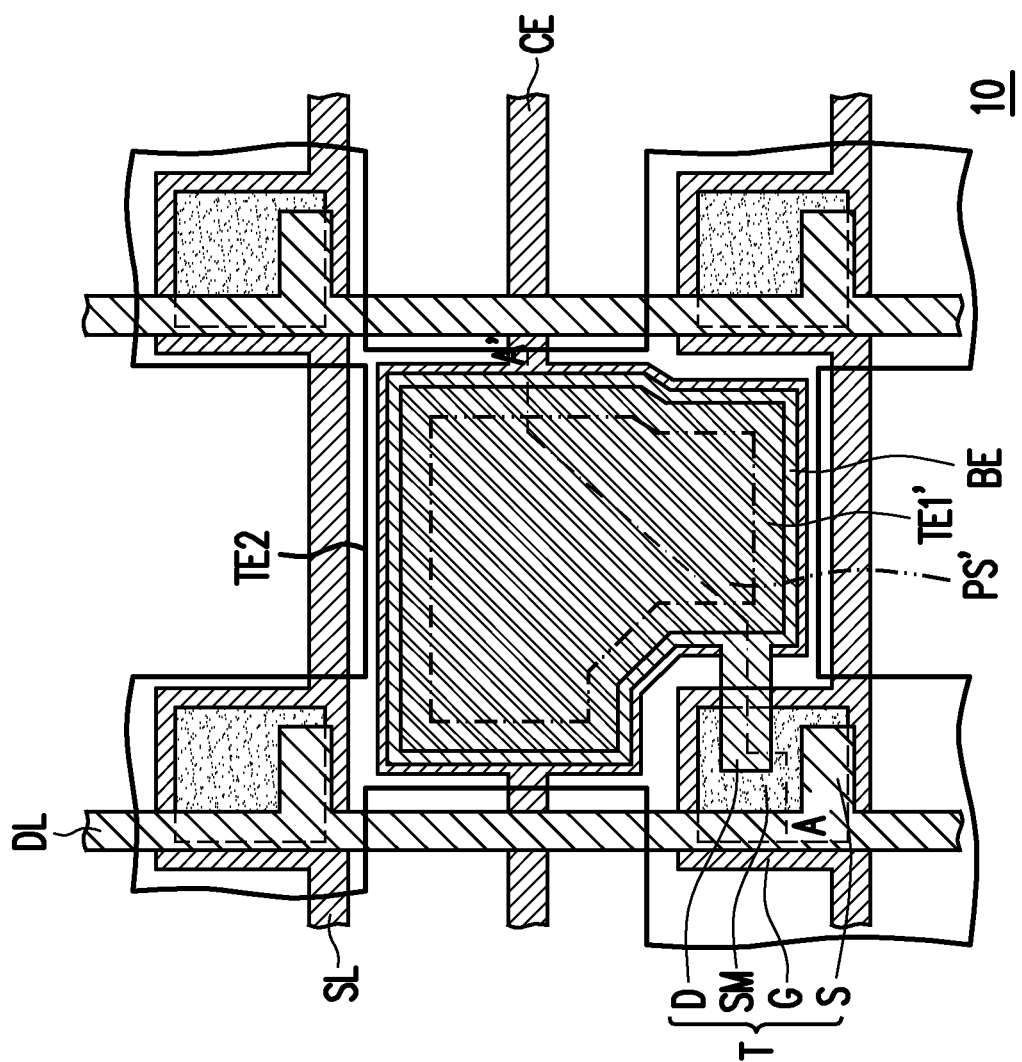
FIG. 2 is a top view of some elements of a photosensitive element according to an embodiment of the invention.

FIG. 1A to FIG. 1O are manufacturing process schematics of a photosensitive element according to an embodiment of the invention. FIG. 2 is a top view of some elements of a photosensitive element according to an embodiment of the invention. FIG. 1O corresponds to the location of section line A-A' of FIG. 2, and FIG. 2 omits some components in FIG. 1O.

Referring to FIG. 1A, a substrate SB is provided, and a patterned first conductive layer M1 is formed on the substrate SB. The substrate SB is, for instance, a rigid substrate or a flexible substrate. For instance, the material of the substrate SB can be glass, plastic, composite material, or other materials that can provide support and can be used for the manufacturing of a plate structure.

The patterned first conductive layer M1 includes a gate G and a capacitor electrode CE. The gate G is electrically connected to a scan line. The capacitor electrode CE is located between two adjacent scan lines. The material of the patterned first conductive layer M1 is a conductive material. For instance, the material of the patterned first conductive layer M1 can be a single- or multi-layer stacked metal material, such as at least one selected from the group consisting of copper (Cu), molybdenum (Mo), titanium (Ti), aluminum (Al), tungsten (W), silver (Ag), gold (Au), and an alloy thereof. The patterned first conductive layer M1 can be manufactured by patterning a metal material via a lithography process, but is not limited thereto.

Figure 1B:
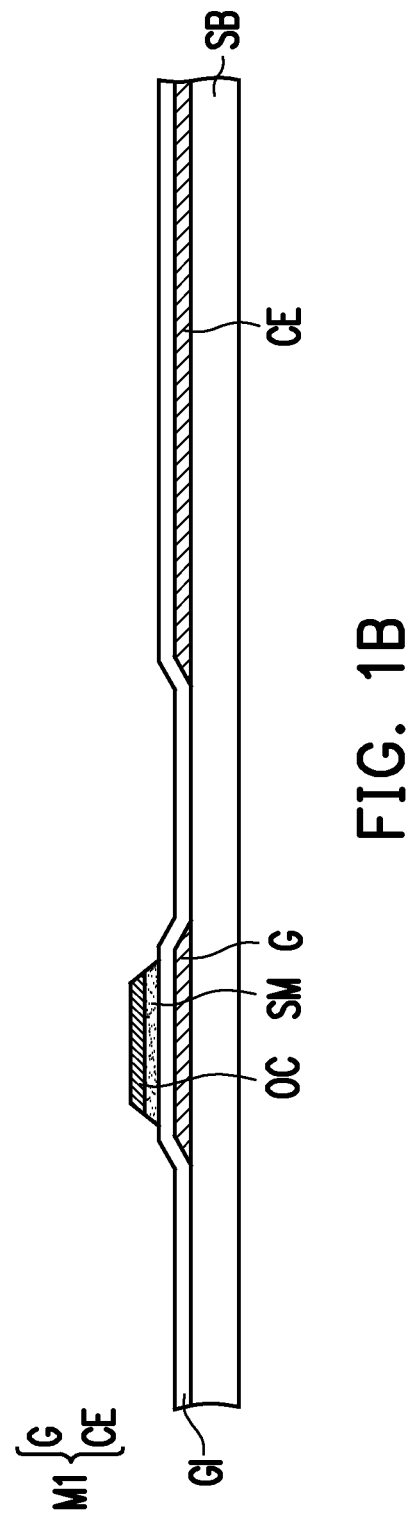

Referring to FIG. 1B, a gate insulation layer GI is formed on the substrate SB and the patterned first conductive layer M1. The patterned first conductive layer M1 is located between the substrate SB and the gate insulation layer GI. The gate insulation layer GI can be a composite structure of a single-layer structure or multi-layer structure, and the material of the gate insulation layer GI is, for instance, silicon nitride, silicon oxide, silicon oxynitride, other suitable dielectric materials, or a combination of the above.

Referring to FIG. 1B, after the gate insulation layer GI is formed, a semiconductor pattern layer SM is formed on the gate insulation layer GI. The semiconductor pattern layer SM is overlapped with the gate G. The semiconductor pattern layer SM is overlapped with the gate G but the two are separated by the gate insulation layer GI and not in contact with each other. In the present embodiment, an Ohmic contact layer OC is formed on the surface of the semiconductor pattern layer SM, but the invention is not limited thereto. The semiconductor pattern layer SM can be a single- or multi-layer structure and contains amorphous silicon, polysilicon, microcrystalline silicon, monocrystalline silicon, organic semiconductor material, oxide semiconductor material (such as indium zinc oxide, indium gallium zinc oxide, other suitable materials, or a combination thereof), other suitable materials, or the above mentioned materials with dopant, or a combination of the materials above.

The material of the Ohmic contact layer OC is, for instance, an N-type doped semiconductor, and the forming method thereof includes, for instance, depositing a semiconductor via a chemical vapor deposition method and performing N-type ion doping at the same time, but the invention is not limited thereto. In other embodiments, the material of the Ohmic contact layer OC can also be a P-type doped semiconductor.

Figure 1C:
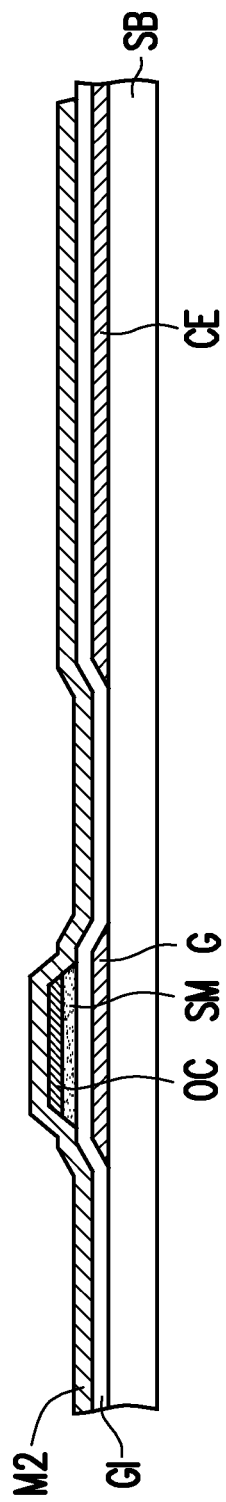

Referring to FIG. 1C, a second conductive layer M2 is formed on the semiconductor pattern layer SM and the gate insulation layer GI. The second conductive layer M2 covers the gate insulation layer GI, the semiconductor pattern layer SM, the Ohmic contact layer OC, and the capacitor electrode CE. The semiconductor pattern layer SM and the Ohmic contact layer OC are located between the gate insulation layer GI and the second conductive layer M2. In the present embodiment, the second conductive layer M2 is, for instance, a Ti/Al/Ti metal structure formed by stacking a plurality of layers of titanium (Ti) and aluminum (Al), but the invention is not limited thereto. The second conductive layer M2 can be a single-layer structure or multi-layer stacked composite structure, and the material thereof is, for instance, a metal material such as titanium, aluminum, molybdenum, silver, palladium (Pd), or an alloy thereof. The material of the second conductive layer M2 can be the same as or different from the material of the patterned first conductive layer M1.

Figure 1D:
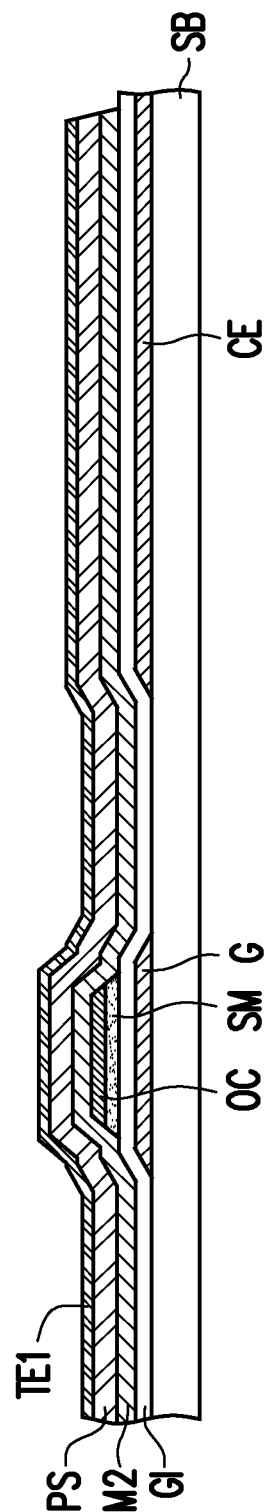

Referring to FIG. 1D, a photosensitive material layer PS and a first top electrode material layer TE1 are deposited on the second conductive layer M2 in order. The second conductive layer M2, the photosensitive material layer PS, and the first top electrode material layer TE1 are successively deposited on the substrate SB. In the present embodiment, the material of the photosensitive material layer PS includes silicon-rich oxide such as a PIN material or PN material, but is not limited thereto. According to other embodiments, the material of the photosensitive material layer PS includes silicon-rich nitride, silicon-rich oxynitride, silicon-rich carbide, silicon-rich carbon oxide, hydrogenated silicon-rich oxide, hydrogenated silicon-rich nitride, hydrogenated silicon-rich carbide, or a combination thereof.

Figure 1E:
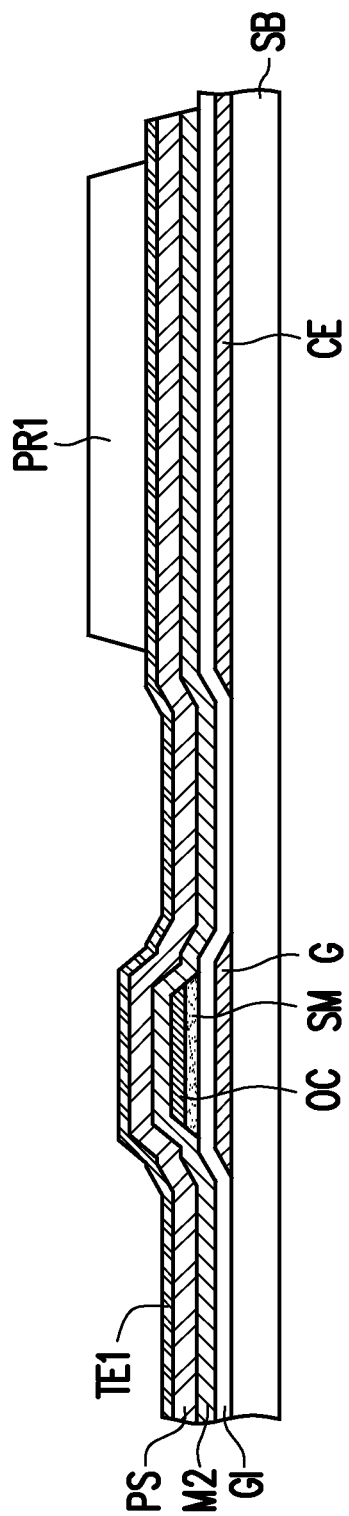

Referring to FIG. 1E, a first patterned photoresist layer PR1 is formed on the first top electrode material layer TE1. In the present embodiment, the first patterned photoresist layer PR1 is overlapped with the capacitor electrode CE, but the invention is not limited thereto.

Figure 1F:
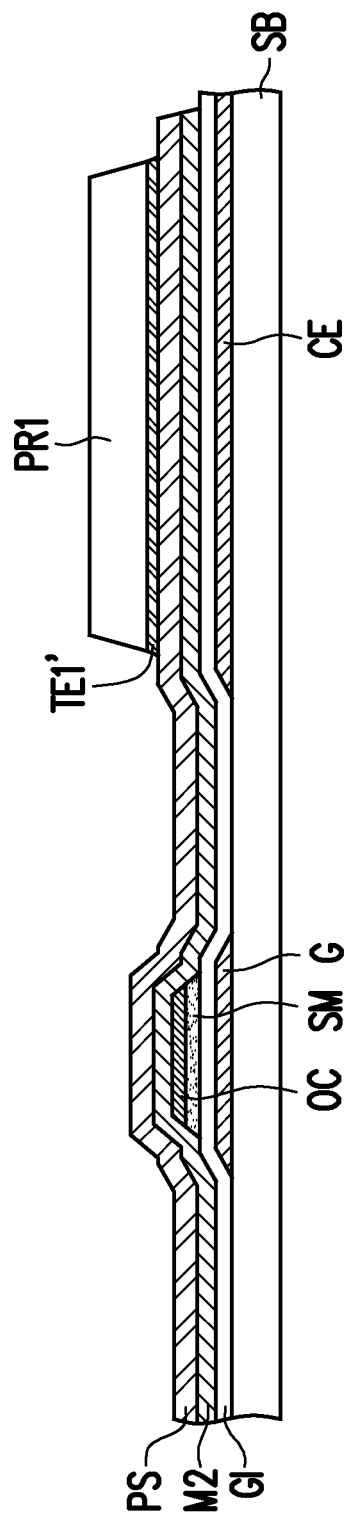

Referring to FIG. 1F, the first top electrode material layer TE1 is patterned by using the first patterned photoresist layer PR1 as a mask to form a first top electrode TE1'. In the present embodiment, the first top electrode TE1' is overlapped with the capacitor electrode CE, but the invention is not limited thereto. In the present embodiment, the first top electrode TE1' can be a transparent conductive material such as metal oxide, such as indium tin oxide, indium zinc oxide, aluminum tin oxide, aluminum zinc oxide, indium gallium zinc oxide, other suitable oxides, or a stacked layer of at least two of the above.

Referring to FIG. 1G, the first patterned photoresist layer PR1 is removed.

Referring to FIG. 1H, the photosensitive material layer PS is patterned by using the first top electrode TE1' as a mask to form a photosensitive layer PS'. In the present embodiment, the photosensitive layer PS' is overlapped with the capacitor electrode CE, but the invention is not limited thereto. In a preferred embodiment, the sizes of the vertical projections of the photosensitive layer PS' and the first top electrode TE1' on the substrate SB are substantially the same. It should be mentioned that, when the photosensitive material layer PS is etched by using the first top electrode TE1' as a mask, lateral etching may occur, such that some lateral etching may occur to the resulting photosensitive layer PS' near the first top electrode TE1' after etching. The material of the photosensitive layer PS' is the same as that of the photosensitive material layer PS and is not repeated herein.

Figure 1I:
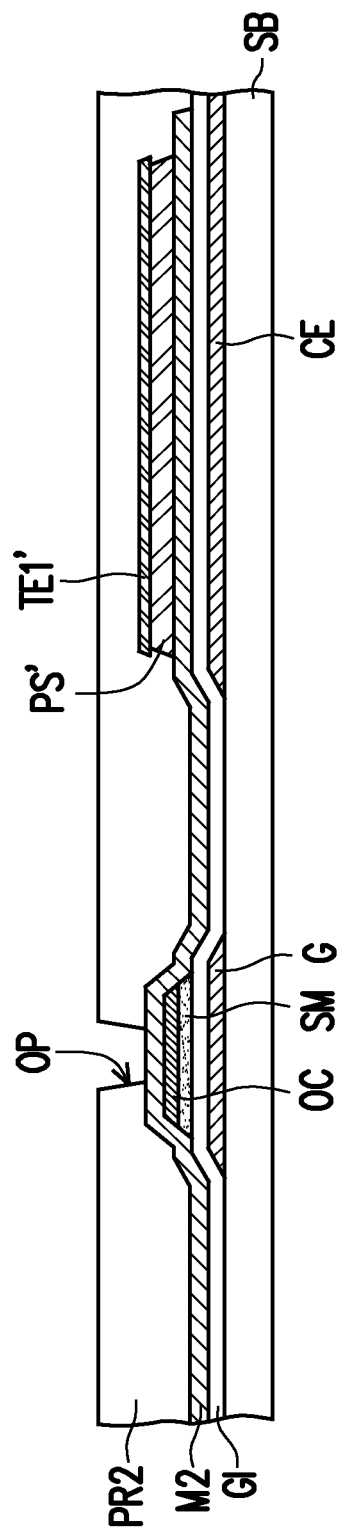

Referring to FIG. 1I, a second patterned photoresist layer PR2 is formed on the second conductive layer M2. The second patterned photoresist layer PR2 has an opening OP corresponding to the semiconductor pattern layer SM to expose a portion of the second conductive layer M2.

Figure 1J:
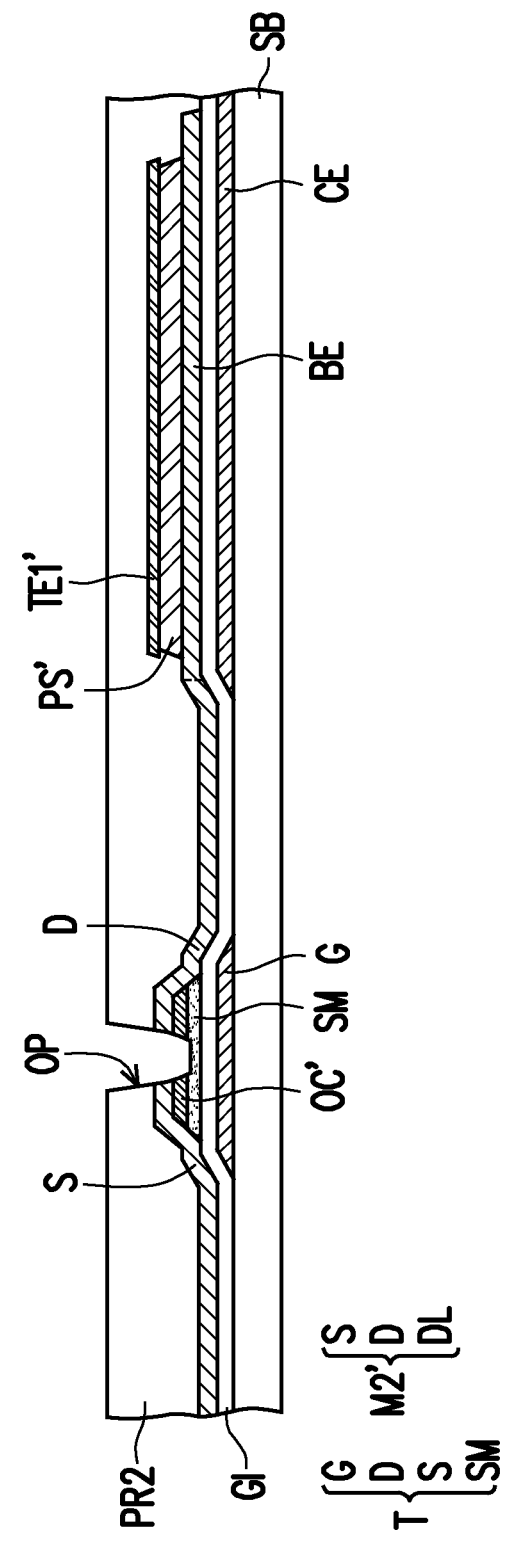

Referring to FIG. 1J, the second conductive layer M2 is patterned by using the second patterned photoresist layer PR2 as a mask to define a patterned electrode layer M2' and a bottom electrode BE. The bottom electrode BE is connected to the patterned electrode layer M2'. In the present embodiment, a portion of the Ohmic contact layer OC is also removed to leave an Ohmic contact layer OC'.

The patterned electrode layer M2' covers a portion of the semiconductor pattern layer SM. The patterned electrode layer M2' includes a source S, a drain D, and a data line DL (shown in FIG. 2). In the present embodiment, the source S and the drain D can be formed by etching using a wet etchant, but the invention is not limited thereto. The wet etchant is, for instance, sulfuric acid, phosphoric acid, nitric acid, acetic acid, or a mixture of at least two of the above, aluminate etching solution, or other suitable etchants. The source S is electrically connected to the data line DL, the drain D is electrically connected to the bottom electrode BE, and the source S and the drain D are electrically connected to the semiconductor pattern layer SM.

The bottom electrode BE is overlapped with the capacitor electrode CE and the two are separated by the gate insulation layer GI and not in contact with each other. The bottom electrode BE, the photosensitive layer PS', and the first top electrode TE1' are stacked on the substrate SB in order.

The bottom electrode BE formed by patterning the second conductive layer M2, the photosensitive layer PS' formed by patterning the photosensitive material layer PS, and the first top electrode TE1' formed by patterning the first top electrode material layer TE1 are successively deposited on the substrate SB. In other words, the bottom electrode BE, the photosensitive material layer PS, and the first top electrode material layer TE1 are successively deposited on the substrate SB. For instance, after the second conductive layer M2 is deposited, the photosensitive material layer PS and the first top electrode material layer TE1 are deposited at least on the bottom electrode BE in the second conductive layer M2. The second conductive layer M2, the photosensitive material layer PS, and the first top electrode material layer TE1 are successively deposited on the substrate SB. In some embodiments, the bottom electrode BE and the photosensitive layer PS' have a substantially flat interface therebetween. In some embodiments, a substantially flat interface is located between the photosensitive layer PS' and the first top electrode TE1', and damage to the interface between layers can be reduced via successive deposition such that the interface between the layers is flatter. Therefore, the issue of poor imaging of the photosensitive element is solved, and display quality of the display device is increased.

In the present embodiment, a switch element T is, for instance, a bottom-gate thin-film transistor including a gate G, a source S, a drain D, and a semiconductor pattern layer SM, but the invention is not limited thereto. In other embodiments, the switch element T can also be a top-gate thin-film transistor or other suitable thin-film transistors. The switch element T is electrically connected to the bottom electrode BE.

A data line DL and a scan line SL are intersected with each other (shown in FIG. 2), and the gate insulation layer GI is disposed between the data line DL and the scan line SL. In an embodiment of the invention, the extending direction of the scan line SL is not parallel to the extending direction of the data line DL as an example. Preferably, the extending direction of the scan line SL and the extending direction of the data line DL are perpendicular to each other.

Referring to FIG. 1K, the second patterned photoresist layer PR2 is removed.

Referring to FIG. 1L, an insulation layer IL is formed on the first top electrode TE1', and the insulation layer IL has an opening O1. The insulation layer IL covers the first top electrode TE1', and the opening O1 exposes a portion of the first top electrode TE1'. The insulation layer IL covers the photosensitive layer PS' and the bottom electrode BE. The insulation layer IL is omitted between the bottom electrode BE and the photosensitive layer PS'. The material of the insulation layer IL contains an inorganic material (such as: silicon oxide, silicon nitride, silicon oxynitride, other suitable materials, or stacked layers of at least two materials thereof), an organic material, other suitable materials, or a combination thereof.

Figure 1M:
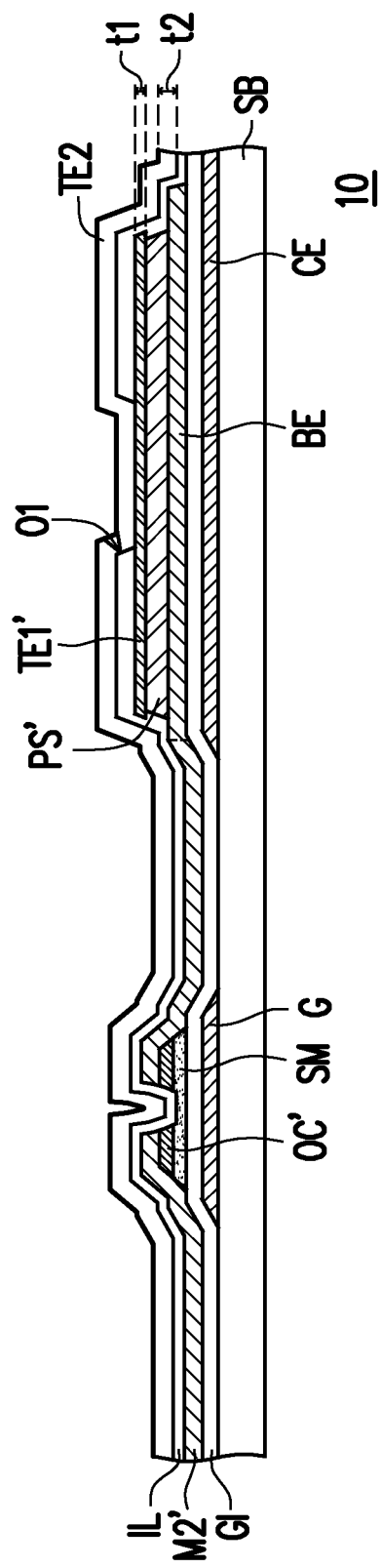

Referring to FIG. 1M, a second top electrode TE2 is formed on the insulation layer IL to largely complete a photosensitive element 10. A portion of the insulation layer IL is located between the first top electrode TE1' and the second top electrode TE2. The second top electrode TE2 is electrically connected to the first top electrode TE1' via the opening O1. In the present embodiment, a thickness t2 of the second top electrode TE2 is greater than a thickness t1 of the first top electrode TE1'. In the present embodiment, the photosensitive layer PS' is flat, and therefore the overlapping area between the bottom electrode BE and the first top electrode TE1' can be maximized to increase the effective electric field between the two. In the present embodiment, the material of the second top electrode TE2 can be the same as or different from that of the first top electrode TE1', the second top electrode TE2 can be a transparent conductive material, and the material is, for instance, a metal oxide such as indium tin oxide, indium zinc oxide, aluminum tin oxide, aluminum zinc oxide, indium gallium zinc oxide, other suitable oxides, or a stacked layer of at least two of the above.

Figure 1N:
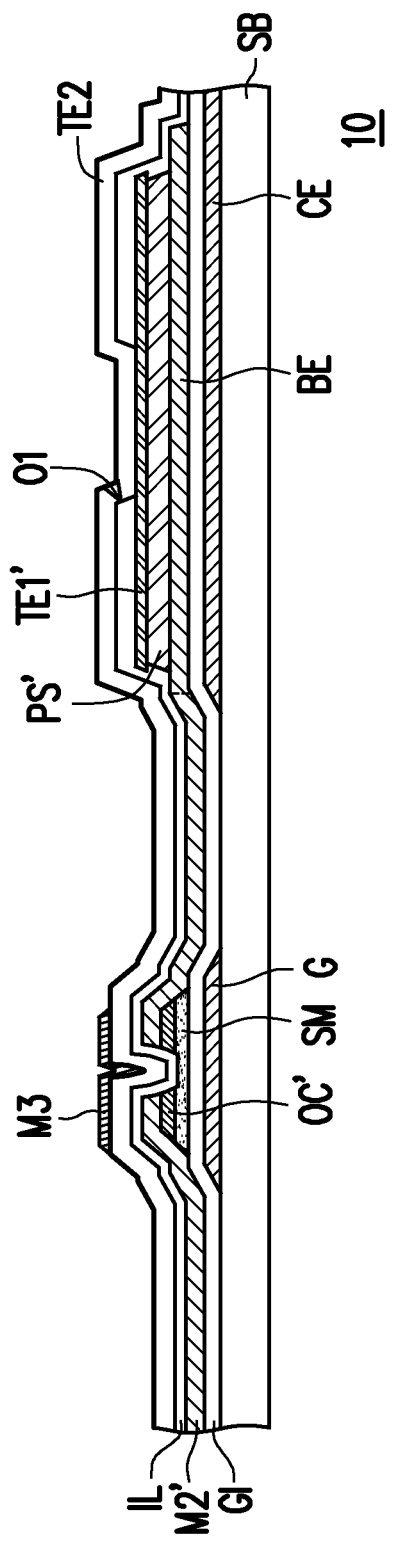
Figure 10:
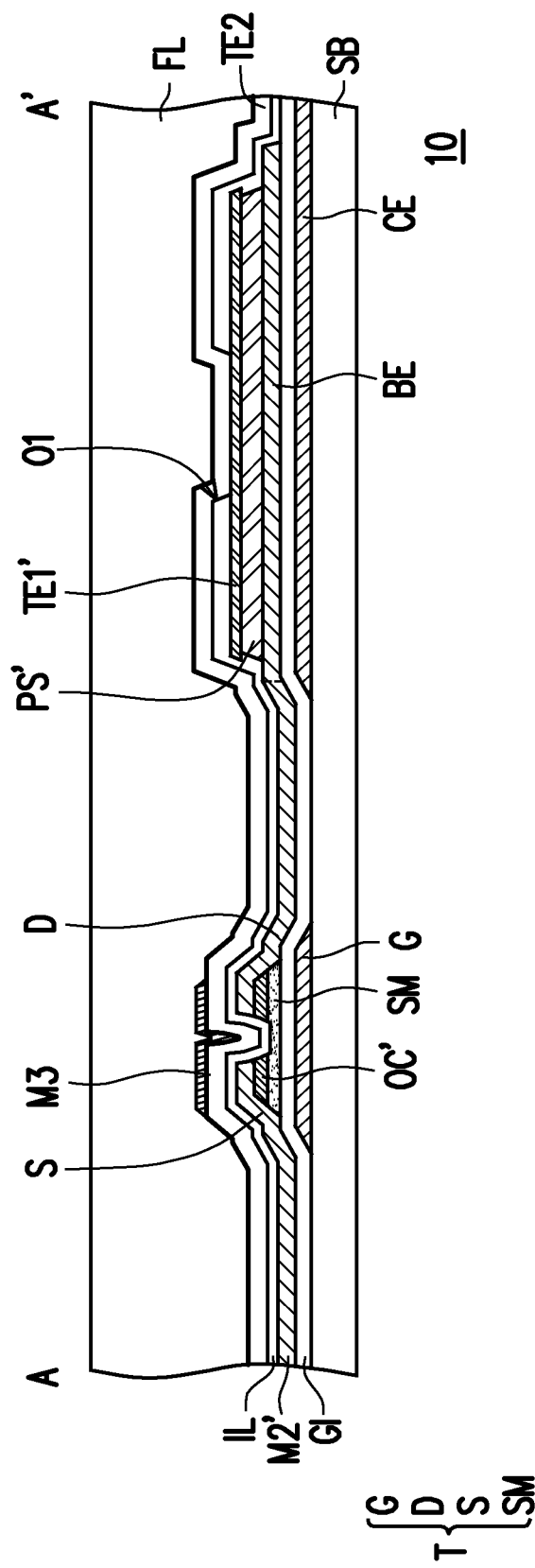

Referring to FIG. 1N, a light-shielding layer M3 is formed on the second top electrode TE2. The light-shielding layer M3 is overlapped with the gate G. The material of the light-shielding layer M3 can be a single- or multi-layer stacked metal material (such as at least one selected from the group consisting of copper, molybdenum, titanium, aluminum, tungsten, silver, gold, and an alloy thereof), a resin material (such as polyimide, acrylate, or other suitable resin materials), graphite, or other suitable materials.

Referring to FIG. 1O, a flat layer FL is formed on the second top electrode TE2. The flat layer FL covers the second top electrode TE2. In the present embodiment, the material of the flat layer FL is an organic material such as polyester (PET), polyolefin, polypropylene, polycarbonate, polyalkylene oxide, polyphenylene, polyether, polyketone, polyol, polyaldehyde, other suitable materials, or a combination thereof, but the invention is not limited thereto. According to other embodiments, the material of the flat layer FL can also be an inorganic material (such as silicon oxide, silicon nitride, silicon oxynitride, other suitable materials, or a stacked layer of at least two of the above materials), other suitable materials, or a combination thereof.

The thickness of the flat layer FL is greater than 2 µm and less than or equal to 25 µm. In a preferred embodiment, the thickness of the flat layer FL is greater than 12 µm and less than or equal to 25 µm. In the present embodiment, an increase in the thickness of the flat layer FL can increase the tolerance of the electronic element for electrostatic discharge (ESD). In the present embodiment, when the thickness of the flat layer FL is greater than 25 µm, the photosensitive element is less responsive.

In the present embodiment, the dielectric strength of the flat layer is greater than 200 MV/m. An increase in the dielectric strength of the flat layer can increase the tolerance of the electronic element for ESD. As a result, the life time of the electronic element can be increased.

Based on the above, via the successive deposition of the bottom electrode BE, the photosensitive layer PS', and the first top electrode TE1', damage to the interface between layers in the photosensitive element 10 can be reduced, and the issue of poor imaging of the photosensitive element can be solved to increase the display quality of the display device.

Figure 3:
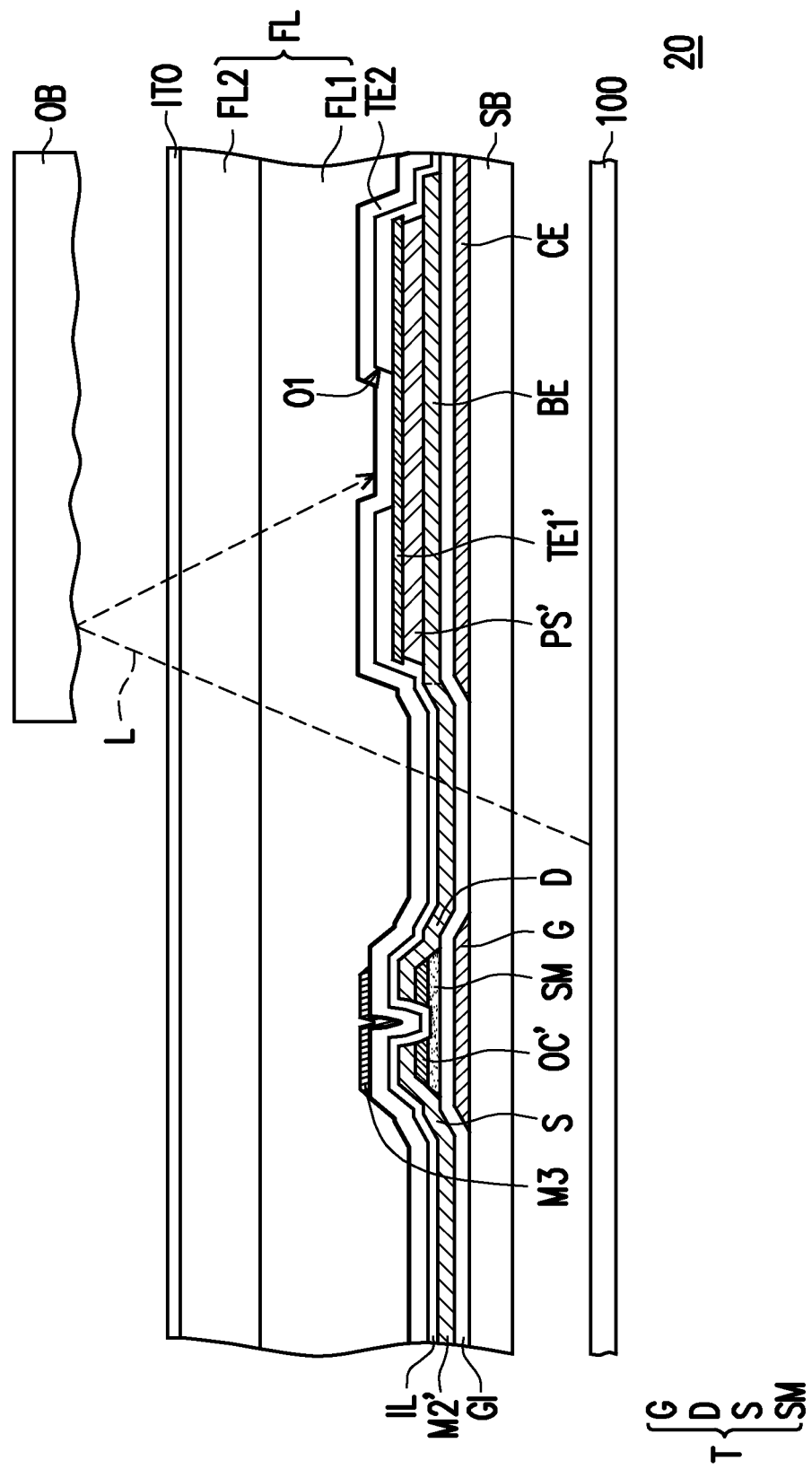
FIG. 3 is a cross section of a photosensitive element according to another embodiment of the invention.

FIG. 3 is a cross section of a photosensitive element according to another embodiment of the invention. It should be mentioned here that, the embodiment of FIG. 3 adopts the reference numerals of the embodiments of FIGS. 1A to 1O and FIG. 2 and a portion of the contents thereof, wherein the same or similar numerals are used to represent the same or similar elements and descriptions of the same technical contents are omitted. The omitted portions are as described in the above embodiments and are not repeated herein.

Referring to FIG. 3, in the present embodiment, the method of forming the flat layer FL includes first forming a first organic flat material layer on the second top electrode TE2, curing the first organic flat material layer to form a first organic flat layer FL1, forming a second organic flat material layer on the first organic flat layer FL1, and curing the second organic flat material layer to form a second organic flat layer FL2. Due to there are two organic flat layers, the organic flat material of each coating can be thinner, and the material can be more completely cured to avoid poor quality of the photosensitive element caused by incomplete curing. In other words, in the present embodiment, the flat layer FL includes two organic flat layers, but is not limited thereto. In other embodiments, the flat layer FL can include one or more than two organic flat layers.

In the present embodiment, after the flat layer FL is formed, a transparent conductive layer ITO is formed on the flat layer FL. The transparent conductive layer ITO, for instance, completely covers the flat layer FL. The transparent conductive layer ITO is electrically connected to a ground voltage. The material of the transparent conductive layer ITO includes a metal oxide such as gallium zinc oxide, indium tin oxide, or indium zinc oxide.

In the present embodiment, a photosensitive element 20 further includes a backlight module 100. The backlight module 100 is located below the substrate SB. When a light L emitted by the backlight module 100 is irradiated on a test object OB located above the transparent conductive layer ITO, the light L is reflected by the test object OB to the photosensitive layer PS'. In an embodiment, the test object OB is, for instance, a finger, and the photosensitive element 20 can detect a state of a fingerprint on the finger.

Based on the above, via the successive deposition of the bottom electrode BE, the photosensitive layer PS', and the first top electrode TE1', damage to the interface between layers in the photosensitive element 20 can be reduced, and the issue of poor imaging of the photosensitive element can be solved to increase the display quality of the display device.

Figure 4:
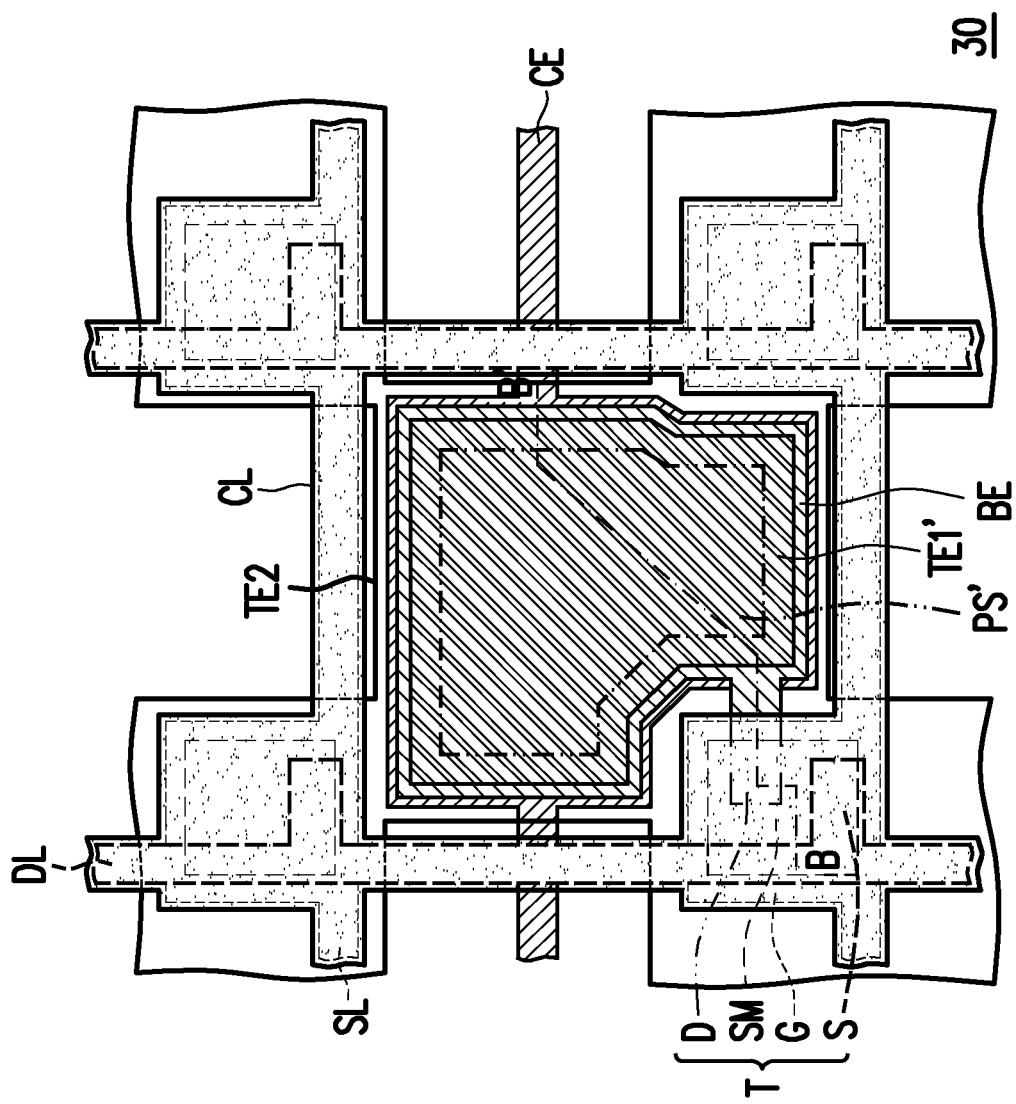
FIG. 4 is a top view of some elements of a photosensitive element according to another embodiment of the invention.
Figure 5:
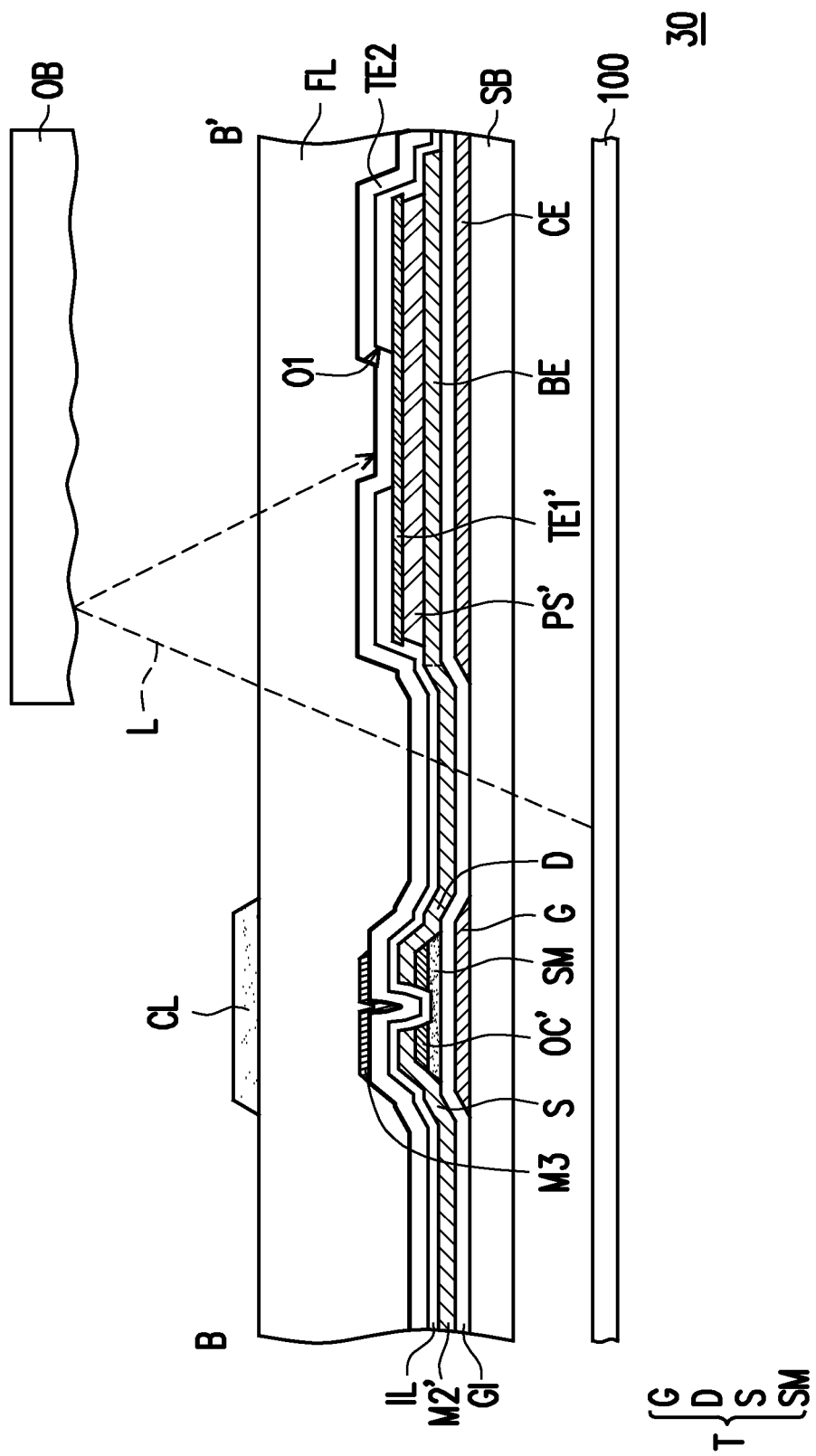
FIG. 5 is a cross section of a photosensitive element shown according to section line B-B' of FIG. 4.

FIG. 4 is a top view of a photosensitive element according to another embodiment of the invention. FIG. 5 is a cross section of a photosensitive element shown according to section line B-B' of FIG. 4. It should be mentioned here that, the embodiments of FIG. 4 and FIG. 5 adopt the reference numerals of the embodiment of FIG. 3 and a portion of the contents thereof, wherein the same or similar numerals are used to represent the same or similar elements and descriptions of the same technical contents are omitted. The omitted portions are described in the previous embodiments and are not repeated in the following embodiments.

The distinguishing feature of the embodiment of FIG. 5 from the embodiment of FIG. 3 is that the transparent conductive layer ITO is replaced by a patterned wire layer CL.

Referring to FIG. 4 and FIG. 5, in a photosensitive element 30 of the present embodiment, a flat layer FL is formed on the second top electrode TE2. Although only one flat layer is formed in the present embodiment, the invention is not limited thereto. In other embodiments, the flat layer FL can be two or more layers.

After the flat layer FL is formed, the patterned wire layer CL is formed on the flat layer FL. The patterned wire layer CL is located on the flat layer FL and overlapped with the switch element T. In the present embodiment, the patterned wire layer CL is further overlapped with the scan line SL and the data line DL to prevent reduced aperture ratio. The patterned wire layer CL is electrically connected to a ground voltage. In the present embodiment, the patterned wire layer CL has the function of antistatic, and can increase the tolerance of the electronic element for ESD. As a result, the life time of the electronic element can be increased.

Based on the above, via the successive deposition of the bottom electrode BE, the photosensitive layer PS', and the first top electrode TE1', damage to the interface between layers in the photosensitive element can be reduced, and the issue of poor imaging of the photosensitive element can be solved to increase the display quality of the display device. Moreover, when the photosensitive element 30 has the patterned wire layer CL having antistatic function, the tolerance of the electronic element for ESD can be increased.

Based on the above, in the photosensitive element and the manufacturing method thereof of the invention, via the successive deposition of the bottom electrode, the photosensitive material layer, and the first top electrode material layer, damage to the interface between layers in the photosensitive element can be reduced. As a result, the issue of poor imaging of the photosensitive element can be solved, and the display quality of the display device can be increased. Moreover, via the flat layer having a high dielectric strength or the patterned wire layer having antistatic function, the tolerance of the electronic element for ESD can be increased, and the service life of the electronic element can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A photosensitive element, comprising:
 a bottom electrode, a photosensitive layer, and a first top electrode stacked on a substrate in order, wherein a material of the photosensitive layer comprises a silicon- rich oxide, wherein the bottom electrode and the photosensitive layer have a substantially flat interface therebetween;

an insulation layer disposed on the first top electrode and covering the first top electrode, the photosensitive layer, and the bottom electrode, and the insulation layer has an opening;

a second top electrode electrically connected to the first top electrode via the opening; and a switch element electrically connected to the bottom electrode, wherein a drain of the switch element and the bottom electrode belong to a same layer, wherein an entire bottom surface of the photosensitive layer is directly in contact with the bottom electrode, and at least a part of a sidewall of the photosensitive layer is located between a bottom surface of the first top electrode and a top surface of the bottom electrode in a direction perpendicular to a top surface of the bottom electrode layer, wherein the bottom electrode overlaps a capacitor electrode.

2. The photosensitive element of claim 1, wherein a thickness of the second top electrode is greater than a thickness of the first top electrode.

3. The photosensitive element of claim 1, wherein a portion of the insulation layer is located between the first top electrode and the second top electrode.

4. The photosensitive element of claim 1, wherein the insulation layer is omitted between the bottom electrode and the photosensitive layer.

5. The photosensitive element of claim 1, further comprising:
a flat layer covering the second top electrode.

6. The photosensitive element of claim 5, further comprising:
a patterned wire layer located on the flat layer and overlapped with the switch element, wherein the patterned wire layer is electrically connected to a ground voltage.

7. The photosensitive element of claim 5, further comprising:
a transparent conductive layer located on the flat layer and electrically connected to a ground voltage.

8. The photosensitive element of claim 1, wherein the second top electrode covers at least a sidewall of the first top electrode.

9. A photosensitive element, comprising:
a bottom electrode, a photosensitive layer, and a first top electrode stacked on a substrate in order, wherein a material of the photosensitive layer comprises a silicon-rich oxide, wherein the bottom electrode and the photosensitive layer have a substantially flat interface therebetween;

an insulation layer disposed on the first top electrode and covering the first top electrode, the photosensitive layer, and the bottom electrode, and the insulation layer has an opening;

a second top electrode electrically connected to the first top electrode via the opening; and a switch element electrically connected to the bottom electrode, wherein a drain of the switch element and the bottom electrode belong to a same layer, wherein an entire bottom surface of the photosensitive layer is directly in contact with the bottom electrode, and at least a part of a sidewall of the photosensitive layer is located between a bottom surface of the first top electrode and a top surface of the bottom electrode in a direction perpendicular to a top surface of the bottom electrode layer, wherein the second top electrode overlaps the switch element.

10. The photosensitive element of claim 9, wherein the bottom electrode overlaps a capacitor electrode.

11. A photosensitive element, comprising:
a bottom electrode, a photosensitive layer, and a first top electrode stacked on a substrate in order, wherein a material of the photosensitive layer comprises a silicon-rich oxide, wherein the bottom electrode and the photosensitive layer have a substantially flat interface therebetween;

an insulation layer disposed on the first top electrode and covering the first top electrode, the photosensitive layer, and the bottom electrode, and the insulation layer has an opening;

a second top electrode electrically connected to the first top electrode via the opening; and a switch element electrically connected to the bottom electrode, wherein a drain of the switch element and the bottom electrode belong to a same layer, wherein an entire bottom surface of the photosensitive layer is directly in contact with the bottom electrode, and at least a part of a sidewall of the photosensitive layer is located between a bottom surface of the first top electrode and a top surface of the bottom electrode in a direction perpendicular to a top surface of the bottom electrode layer, wherein the insulation layer directly contacts the first top electrode and a semiconductor pattern layer of the switch element.

12. The photosensitive element of claim 11, wherein a thickness of the second top electrode is greater than a thickness of the first top electrode.

13. The photosensitive element of claim 11, wherein a portion of the insulation layer is located between the first top electrode and the second top electrode.

14. The photosensitive element of claim 11, wherein the insulation layer is omitted between the bottom electrode and the photosensitive layer.

15. The photosensitive element of claim 11, further comprising:
a flat layer covering the second top electrode.

16. The photosensitive element of claim 15, further comprising:
a patterned wire layer located on the flat layer and overlapped with the switch element, wherein the patterned wire layer is electrically connected to a ground voltage.

17. The photosensitive element of claim 15, further comprising:
a transparent conductive layer located on the flat layer and electrically connected to a ground voltage.

18. The photosensitive element of claim 11, wherein the bottom electrode overlaps a capacitor electrode.

19. The photosensitive element of claim 11, wherein the second top electrode overlaps the switch element.

20. The photosensitive element of claim 11, wherein the second top electrode covers at least a sidewall of the first top electrode.

* * * * *